(12) United States Patent
Cho

(10) Patent No.: US 8,772,918 B2
(45) Date of Patent: Jul. 8, 2014

(54) SEMICONDUCTOR DIE PACKAGE AND EMBEDDED PRINTED CIRCUIT BOARD

(75) Inventor: Shi-Yun Cho, Anyang-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 593 days.

(21) Appl. No.: 12/029,502

(22) Filed: Feb. 12, 2008

(65) Prior Publication Data

US 2008/0191337 A1  Aug. 14, 2008

(30) Foreign Application Priority Data

Feb. 13, 2007  (KR) .................. 10-2007-0015055

(51) Int. Cl.
*H01L 23/06* (2006.01)
(52) U.S. Cl.
USPC ............ 257/684; 257/720; 257/778; 438/613
(58) Field of Classification Search
CPC ................... H01L 2224/73202; H05K 1/0203; H05K 3/0061
USPC ................... 257/E23.114, 684–788; 438/614
See application file for complete search history.

(56) References Cited

U.S. PATENT DOCUMENTS

| | | | |
|---|---|---|---|
| 2002/0195719 A1* | 12/2002 | Shah et al. ..................... | 257/778 |
| 2003/0071363 A1* | 4/2003 | Yoshida et al. ................ | 257/778 |
| 2005/0104226 A1* | 5/2005 | Chang et al. ................... | 257/781 |
| 2005/0133933 A1* | 6/2005 | Shen et al. ..................... | 257/779 |
| 2007/0018312 A1* | 1/2007 | Jo ................................... | 257/720 |
| 2007/0045841 A1* | 3/2007 | Cho et al. ....................... | 257/737 |

FOREIGN PATENT DOCUMENTS

KR    2000-12271    7/2000    .............. H01L 23/28

OTHER PUBLICATIONS

Akram, Salman, et al.; Patent Application Publication No. US 2003-0151129; Publication Date: Aug. 14, 2003; "Method and Apparatus for Conducting Heat in a Flip-Chip . . . ;". . . .

* cited by examiner

*Primary Examiner* — Eugene Lee
*Assistant Examiner* — Fang-Xing Jiang
(74) *Attorney, Agent, or Firm* — Cha & Reiter, LLC

(57) ABSTRACT

A semiconductor die package having an enhanced degree of heating radiation from the semiconductor, thereby reducing mechanical and electrical failure from excessive temperatures. A semiconductor die has circuit patterns formed thereon; a bump pad deposited on the semiconductor die and supporting at least one of the bumps electrically connected to the circuit patterns; and a radiating pad formed on an upper surface of the bump pad such that the radiating pad surrounds the bumps. An embedded printed circuit substrate includes a radiating pad formed on the bump pad to surround the bumps; and a core substrate has a through-hole formed in the core substrate, that extends from an upper surface of the core substrate to a lower surface thereof. The semiconductor die is deposited on the upper surface of the core substrate such that the bumps extend through the through-hole.

13 Claims, 3 Drawing Sheets

SEMICONDUCTOR DIE PACKAGE AND EMBEDDED PRINTED CIRCUIT BOARD

CLAIM OF PRIORITY

This application claims priority under 35 U.S.C. §119(a) from an application entitled "Semiconductor Die Package And Embedded Printed Circuit Board," filed in the Korean Intellectual Property Office on Feb. 13, 2007 and assigned Serial No. 2007-15055, the contents of which are hereby incorporated by reference in its entirety.

BACKGROUND OF THE INVENTION

1. Field of the Invention

The present invention relates to a printed circuit substrate. More particularly, the present invention relates to an embedded printed circuit substrate having passive parts embedded therein.

2. Description of the Related Art

An embedded printed circuit substrate has passive parts, such as capacitors, embedded therein so that wiring with active parts have short lengths. By constructing a printed circuit substrate in this matter, a more stable print circuit with an acceptable amount of reliability and predetermined electric characteristics is achieved.

Furthermore, a conventional embedded printed circuit substrate can be constructed by employing a substrate having an area smaller than an area of an external printed circuit substrate. Therefore, the embedded printed circuit substrate has become increasingly popular and is employed in many various types of portable electric devices, particularly those in which a minimal size is desired. The above-described embedded printed circuit substrate typically is comprised of active parts, such as semiconductor dies, as well as the passive parts mounted therein, and the embedded printed circuit substrate is also employed in an antennas, etc.

However, a conventional embedded printed circuit substrate, in which the active parts (such as the semiconductor dies) are mounted, has a problem with thermal stability. Furthermore, in the conventional embedded printed circuit substrate, the active parts generating a large amount of heat, such as the semiconductor dies, are buried in an insulating layer, thereby causing a problem in relation to heat radiation, as it is difficult to transfer heat to the exterior of the printed circuit, let alone transfer heat to, for example, a heat sink, etc.

Such problems associated with heat radiation is often responsible for causing erroneous operation of the semiconductor dies. Therefore, with conventional printed circuits substrate having embedding of passive parts, it is often difficult to secure a stable operation characteristic, and the lifetime of such semiconductor dies can be reduced.

SUMMARY OF THE INVENTION

Accordingly, the present invention has been made in part to solve at least some of the above-mentioned problems occurring in the prior art, and the present invention provides a semiconductor die having an improved efficiency with regard to heat radiation.

In addition, the present invention provides an embedded printed circuit substrate in which a semiconductor die is mounted.

In accordance with the first exemplary aspect of the present invention, there is provided a semiconductor die package including: a semiconductor die having circuit patterns formed thereon (on the semiconductor die); a bump pad deposited on the semiconductor die and supporting at least one of bumps electrically connected to the circuit patterns; and a radiating pad formed on an upper surface of the bump pad in such a manner that the radiating pad surrounds the bumps.

In accordance with the second exemplary aspect of the present invention, there is provided an embedded printed circuit substrate including: a semiconductor die having circuit patterns formed thereon; a bump pad having at least one bump connected to the circuit patterns formed on the semiconductor die; a radiating pad deposited on the bump pad to surround the bumps; and a core substrate having a through-hole formed therein, the through hole extending from an upper surface of the core substrate to a lower surface of the core substrate, wherein the semiconductor die is deposited on the upper surface of the core substrate such that the bumps typically extend through the through-hole.

BRIEF DESCRIPTION OF THE DRAWINGS

The above and other exemplary aspects, features and advantages of the present invention will be more apparent from the following detailed description taken in conjunction with the accompanying drawings, in which.

DETAILED DESCRIPTION OF THE INVENTION

Hereinafter, exemplary embodiments of the present invention will be described with reference to the accompanying drawings. For the purposes of clarity and simplicity, a detailed description of known functions and configurations incorporated herein will be omitted as such known functions and configurations may obscure appreciation of the subject matter of the present invention by a person of ordinary skill in the art.

Figure 1:
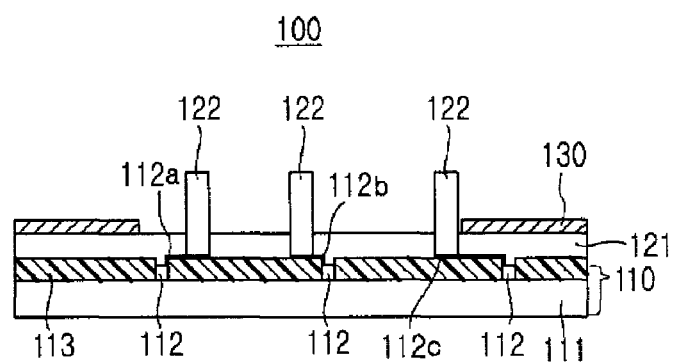
FIG. 1 is a sectional view illustrating a structure of a semiconductor die according to the first exemplary embodiment of the present invention.

FIG. 1 is a sectional view illustrating a structure of a semiconductor die package according to the first exemplary embodiment according to the present invention. In addition, FIG. 2 is a plan view illustrating the semiconductor die package shown in FIG. 1.

Figure 2:
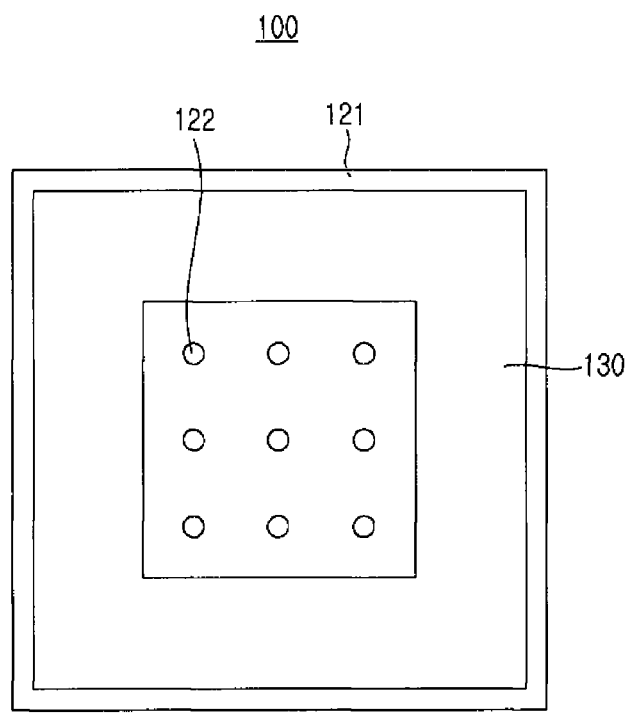
FIG. 2 is a plan view illustrating the semiconductor die shown in FIG. 1.

Referring to FIGS. 1 and 2, the semiconductor die package 100 according to the present exemplary embodiment includes a semiconductor die 110 and at least one bump 122, and includes a bump pad 121 deposited on the semiconductor die 110 and a radiating pad 130 deposited on an upper surface of the bump pad 121 so as to surround the bumps 122.

The semiconductor die 110 includes a wafer block 111, an insulating layer 113 formed on an upper surface of the wafer block 111, circuit patterns 112 formed on the upper surface of the wafer block 111, and electric wirings 112a, 112b, and 112c electrically connecting between the respective bumps 122 and the respective circuit patterns 112.

Still referring to FIG. 1, the insulating layer 113 can be formed on the wafer block 111 such that an upper surfaces of the respective circuit patterns 112 are exposed to the exterior, and the rest of the respective circuit patterns 112, except the upper surfaces thereof, are surrounded by the insulating layer 113. The insulating layer 113 may use dielectric substances such as $SiO_2$, etc.

The electric wirings 112a, 112b, and 112c extend from the respective circuit patterns 112, and are formed on the insulating layer 113.

The bump pad 121 is formed on the insulating layer 113, and the respective bumps 122 extend through the bump pad 121. Particularly, each bump 122 has a lower surface thereof facing the insulating layer 113 and can be electrically connected to the corresponding electric wirings 112a, 112b, and 112c.

Still referring to FIG. 1, the radiating pad 130 can be made of material such as a metal, in order to have a good heat radiation characteristic, and is typically formed while there is a distance with the bumps 122, thereby keeping an insulation state such that the radiating pad 130 does not make electric contact with the bumps 122.

In the semiconductor die package 100 according to the present exemplary embodiment, the radiating pad 130 is attached to the upper surface of the bump pad 121 for a rewiring process of the semiconductor die 110. Therefore, thermal stability can be improved.

Furthermore, according to the present invention, in order to make it easier to mount the semiconductor die package 100 on the embedded printed circuit substrate, it is preferable that each bump 122 has a sectional area larger than that of the circuit patterns 112, and each bump 122 has a height higher than a vertical level (upper surface) of the radiating pad 130.

Figure 3A:
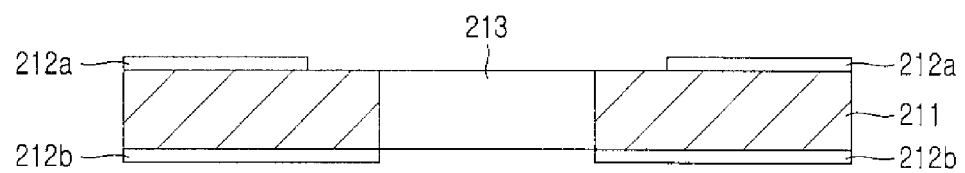
FIGS. 3A to 3C are sectional views illustrating an embedded printed circuit substrate according to a second exemplary embodiment of the present invention, in which the embedded printed circuit substrate is assembled in each assembling step.
Figure 3B:
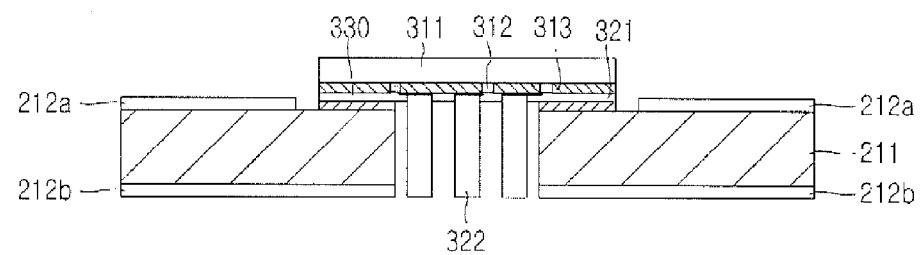
Figure 3C:
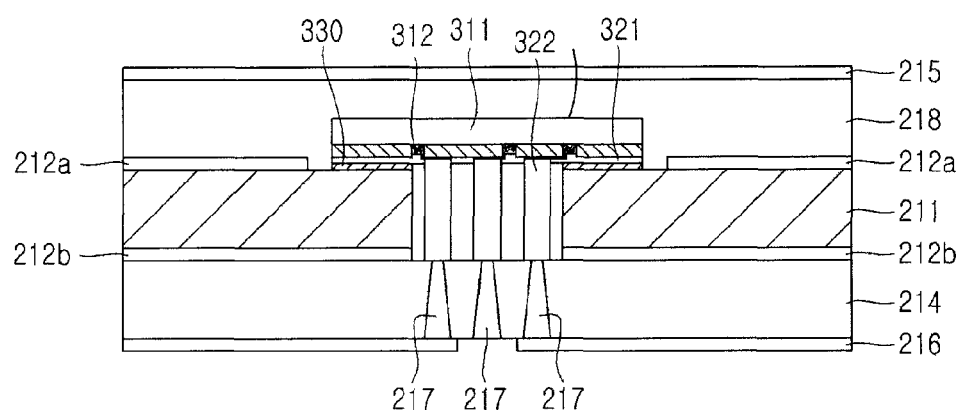

FIGS. 3A to 3C are sectional views illustrating the embedded printed circuit substrate according to the second exemplary embodiment of the present invention, in which the embedded printed circuit substrate is assembled in each assembling step. Particularly, FIG. 3C is a sectional view illustrating the embedded printed circuit substrate according to the present exemplary embodiment, wherein the embedded printed circuit substrate is assembled completely.

The embedded printed circuit substrate according to the present embodiment may include the semiconductor die package 300, a core substrate 211, insulating substrates 218 and 214, conductive pattern layers 212a, 212b, 215, and 216 interposed between the core substrate 211 and the insulating substrates 218 and 214.

The semiconductor die package 300 includes a semiconductor die 311 having circuit patterns 312 formed therein, a bump pad 321 having at least one bump 322 connected to the circuit patterns 312, and a radiating pad 330 deposited on the bump pad 321 such that the radiating pad 330 surrounds the bumps 322. The configuration and the structure of the semiconductor die package according to the present exemplary embodiment are typically similar to those of the semiconductor die package 110 according to the first exemplary embodiment of the present invention.

The core substrate 211 has a through-hole 213 formed therein such that the through-hole 213 typically extends from an upper surface of the core substrate 211 to a lower surface thereof as shown in FIG. 3A, and the conductive pattern layers 212a and 212b are formed on the upper and the lower surface of the core substrate 211, respectively.

As shown in FIG. 3B, the semiconductor die package is deposited on the upper surface of the core substrate 211, and the bumps 322 may be typically formed such that they are long enough to reach the insulating substrate 214 shown in FIG. 3C. Furthermore, the semiconductor die package is deposited on the upper surface of the core substrate 211 in such a manner that the radiating pad 330 can make contact with the upper surface of the core substrate 211.

Particularly, the through-hole 213 provides a space allowing the electric wirings Of the bumps 322 and allowing the semiconductor die package to be mounted in the interior of the embedded printed circuit substrate.

FIG. 3C is a sectional view illustrating the structure of the embedded printed circuit substrate according to the present exemplary embodiment. The embedded printed circuit substrate has the insulating substrates 218 and 214 disposed above and below the core substrate 211, respectively, so as to center the core substrate there between, and the conductive pattern layers 212a, 212b, 215, and 216 are interposed between the core substrate 211 and the insulating substrates 218 and 214.

The insulating layers 218, 214 can be further added to the embedded printed Circuit substrate according to the configuration of the embedded printed circuit substrate. The wirings 217 are formed by filling conductive material in a hole extending through the insulting substrate 214, and the respective bumps 322 can be electrically connected to the conductive pattern layer 212b by the wirings 217.

According to the present invention, there is an advantage in that by attaching the radiating pad to the upper surface of the semiconductor die, the heat radiated by the semiconductor easily escapes, thereby reducing mechanical and electrical failure from excessive temperatures. In addition, it is possible to provide an embedded printed circuit substrate in which a power amplifier having a radiating pad attached thereto, etc. are mounted.

While the invention has been shown and described with reference to certain exemplary embodiments thereof, it will be understood by those skilled in the art that various changes in form and details may be made therein without departing from the spirit of the invention and the scope of the appended claims. For example, while the term "deposited" is used at various points in the specification to disclose the connection of the solder bumps to the respective circuit patterns, any method by which the solder bumps are arranged/connected so to be in electrical connection with the respective circuit patterns is within the spirit of the invention and scope of the appended claims as well. Also, the claimed invention is not limited to technology using solder bumps as described in the aforementioned examples, and is applicable with various types of semiconductor fabrication. Further, a person of ordinary skill in the art also understands and appreciates that the arrangement/burying of the respective circuit patterns can be a partial placement within the insulating layer, or there could be a more complete placement and the electrical wiring extending further therein, but the amount of radiated heat that is permitted to escape is enhanced by having a portion of the circuit pattern extended from, or through an opening in the insulating layer.

What is claimed is:

1. A semiconductor die package comprising:
   a semiconductor die having a surface, and one or more circuit patterns formed on the surface, wherein a respective first cross-section of each of the one or more circuit patterns is substantially parallel to the surface;
   at least three bumps electrically connected respectively to the one or more circuit patterns, wherein each of the at least three bumps has a respective second cross-section substantially parallel to the surface, and wherein each respective second cross-section of each of the at least three bumps has an area greater than the area of the respective first cross-section of the corresponding circuit pattern electrically connected to the respective bump;
   a bump pad disposed on the surface of the semiconductor die and having at least one opening through which the one or more bumps extend; and a radiating pad, formed on an upper surface of the bump pad that is disposed on the surface of the semiconductor die, said radiating pad being arranged to surround the at least three bumps to maximize a transfer of thermal energy received from the semiconductor die that is radiated by the radiating pad;

wherein lower portions of the at least three bumps are buried in the bump pad and upper portions of the at least three bumps are exposed to an exterior, wherein lower and upper portions of each of the at least three bumps have a uniform width and wherein the radiating pad has a rectangular opening and the at least three bumps pass through the rectangular opening.

2. The semiconductor die package according to claim 1, wherein the at least three bumps are respectively electrically connected to the one or more circuit patterns, respectively.

3. The semiconductor die package according to claim 1, wherein the radiating pad is comprised of a metal.

4. The semiconductor die package according to claim 2, wherein each of the at least three bumps has a height higher than an upper level of the radiating pad.

5. The semiconductor die package according to claim 2, wherein the radiating pad is electrically insulated from the at least three bumps.

6. The semiconductor die package according to claim 1, wherein each of the one or more circuit patterns has an upper surface, and the semiconductor die further comprises a wafer block and an insulating layer formed on an upper surface of the wafer block, wherein said one or more circuit patterns are arranged respectively in the insulating layer such that at least a portion of the upper surface of at least some of the respective circuit patterns are exposed to an exterior.

7. The semiconductor die package according to claim 2, wherein each of the one or more circuit patterns has an upper surface, and the semiconductor die further comprises a wafer block and an insulating layer formed on an upper surface of the wafer block, wherein said one or more circuit patterns are arranged respectively in the insulating layer such that at least a portion of the upper surface of at least some of the respective circuit patterns are exposed to an exterior.

8. The semiconductor die package according to claim 6, wherein the insulating layer comprises openings in which said at least the portion of the upper surface of the respective circuit patterns are exposed to the exterior.

9. The semiconductor die package according to claim 1, wherein the semiconductor die further comprises wiring electrically connecting between the at least three bumps and the respective circuit patterns.

10. A semiconductor die package comprising:

a semiconductor die having a wafer block with a surface, and a plurality of circuit patterns formed on the surface, wherein a respective first cross-section of each of the plurality of circuit patterns is substantially parallel to the surface;

at least three bumps, with each bump electrically connected to a respective one of the plurality of circuit patterns, wherein each of at least three bumps has a respective second cross-section substantially parallel to the surface, and wherein each respective second cross-section of each bump has an area greater than the area of the respective first cross-section of the corresponding circuit pattern electrically connected to the respective bump;

a bump pad disposed on the surface of the semiconductor die and having at least one opening through which the plurality of bumps extend; and a radiating pad, formed on an upper surface of the bump pad that is disposed on the surface of the semiconductor die, said radiating pad being arranged to surround the plurality of bumps to maximize a transfer of thermal energy received from the semiconductor die that is radiated by the radiating pad;

wherein lower portions of the at least three bumps are buried in the bump pad and upper portions of the at least three bumps are exposed to an exterior, wherein lower and upper portions of each of the plurality of bumps have a uniform width, and wherein the radiating pad has a rectangular opening and the at least three bumps pass through the rectangular opening.

11. The semiconductor die package according to claim 10, wherein the radiating pad is comprised of a metal.

12. The semiconductor die package according to claim 10, wherein each of the at least three bumps has a height higher than an upper level of the radiating pad.

13. The semiconductor die package according to claim 10, wherein the radiating pad is electrically insulated from the at least three bumps.

\* \* \* \* \*

UNITED STATES PATENT AND TRADEMARK OFFICE
CERTIFICATE OF CORRECTION

| | |
|---|---|
| PATENT NO. | : 8,772,918 B2 |
| APPLICATION NO. | : 12/029502 |
| DATED | : July 8, 2014 |
| INVENTOR(S) | : Shi-Yun Cho |

Page 1 of 1

It is certified that error appears in the above-identified patent and that said Letters Patent is hereby corrected as shown below:

In the Claims:

Column 6, Claim 10, Line 13 should read as follows:
--...each of the at least...--

Signed and Sealed this
Sixteenth Day of September, 2014

Michelle K. Lee
*Deputy Director of the United States Patent and Trademark Office*